United States Patent
Lida et al.

(10) Patent No.: US 9,210,018 B2
(45) Date of Patent: *Dec. 8, 2015

(54) SLICER FOR DYNAMICALLY MODULATED SYMBOLS

(71) Applicant: Valens Semiconductor Ltd., Hod Hasharon (IL)

(72) Inventors: Eyran Lida, Kfar Ha-Oranim (IL); Gaby Gur Cohen, Tel-Mond (IL); Aviv Salamon, Raanana (IL)

(73) Assignee: Valens Semiconductor Ltd., Hod Hasharon (IL)

( * ) Notice: Subject to any disclaimer, the term of this patent is extended or adjusted under 35 U.S.C. 154(b) by 0 days.

This patent is subject to a terminal disclaimer.

(21) Appl. No.: 14/536,654

(22) Filed: Nov. 9, 2014

(65) Prior Publication Data

US 2015/0063474 A1  Mar. 5, 2015

Related U.S. Application Data

(63) Continuation of application No. 12/910,807, filed on Oct. 24, 2010, now Pat. No. 8,930,795.

(51) Int. Cl.
| | |
|---|---|
| *G06F 11/00* | (2006.01) |
| *H04L 27/00* | (2006.01) |
| *H04L 1/00* | (2006.01) |
| *H04L 25/03* | (2006.01) |
| *H03M 13/09* | (2006.01) |
| *H04L 5/00* | (2006.01) |

(52) U.S. Cl.
CPC .............. *H04L 27/0008* (2013.01); *H04L 1/00* (2013.01); *H04L 1/0003* (2013.01); *H04L 1/0036* (2013.01); *H04L 25/03006* (2013.01); *H04L 27/0012* (2013.01); *H03M 13/09* (2013.01); *H04L 5/0007* (2013.01); *H04L 5/0044* (2013.01); *H04L 2025/03363* (2013.01)

(58) Field of Classification Search
CPC . H04L 1/0003; H04L 1/0036; H04L 27/0008; H04L 27/0012
See application file for complete search history.

(56) References Cited

U.S. PATENT DOCUMENTS

| | | |
|---|---|---|
| 5,541,964 A | 7/1996 | Cohen et al. |
| 5,608,755 A | 3/1997 | Rakib |
| 6,269,116 B1 | 7/2001 | Javerbring et al. |
| 6,463,103 B1 | 10/2002 | Dong et al. |
| 6,570,919 B1 | 5/2003 | Lee |
| 6,697,424 B1 | 2/2004 | Yang et al. |
| 6,912,208 B2 | 6/2005 | Zimmerman et al. |
| 8,023,530 B1 | 9/2011 | Giallorenzi et al. |
| 8,027,409 B2 | 9/2011 | Aziz et al. |
| 2002/0057713 A1 | 5/2002 | Bagchi et al. |
| 2005/0129107 A1 | 6/2005 | Park et al. |
| 2005/0249275 A1 | 11/2005 | Yen et al. |
| 2007/0230554 A1 | 10/2007 | Said et al. |
| 2009/0110047 A1 | 4/2009 | Lai et al. |

*Primary Examiner* — Michael Maskulinski
(74) *Attorney, Agent, or Firm* — Active Knowledge Ltd.

(57) ABSTRACT

Receivers designed to reduce decision based filter error propagation by feedback from PCS to slicer. One embodiment includes a slicer, a physical coding sublayer (PCS), and a decision based filter (DBF). The frames include symbols of at least two different modulation orders. The slicer has slicing functions suitable for the different modulations and feeds the PCS with the slicing results. The PCS identifies frame boundaries and modulation information, which are modulated according to a predetermined modulation order, uses the identified modulation information to determine the modulation of a nonempty set of dynamically modulated symbols in each frame, and provides the slicer with an indication of which slicer function output to use to feed the DBF.

22 Claims, 10 Drawing Sheets

SLICER FOR DYNAMICALLY MODULATED SYMBOLS

BACKGROUND

In some embodiments, a transmitter transmits a packet comprising symbols over a channel to a receiver. The symbols are modulated according to the data they carry, such that symbols carrying different data types may be modulated with different modulations. The different modulations used for successive symbols within the same packet are selected from a subset of the same symbol set, or at least from partially overlapping subsets of the same symbol set. For example, a single packet may include X symbols modulated using PAM4, then Y symbols modulated using PAM8, then Z symbols modulated using PAM16, and then again X symbols modulated using PAM4. As a result, in order to decode the transmission properly, the receiver should determine the proper modulation for decoding each symbol or set of symbols. Referring to the last example, the receiver should demodulate the first X symbols using a PAM4 slicer, then demodulate the next Y symbols using a PAM8 slicer, then demodulate the next Z symbols using a PAM16 slicer, and then demodulate the last X symbols using the PAM4 slicer.

Different modulations for successive symbols within the same packet that are selected from subsets of the same symbol set, or at least from partially overlapping subsets of the same symbol set, are discussed in US patent publication number 2009/0115911 to Lida et al, entitled "methods for transmitting digital multimedia and data over the same wires", which is incorporated herein by reference in its entirety. Therefore, the PAM4, PAM8, and PAM16 modulations used in the last example are modified PAM modulations having overlapping amplitude levels.

As explain above, in order for the receiver to properly decode symbols of different modulations within the same packet, the receiver should know the symbol's modulation and select the proper slicer. However, there are embodiments where at least some of the symbols' modulations are unknown to the receiver before slicing the symbols, and thus one or more of the methods discussed below are utilized to improve the receiver's performance.

BRIEF SUMMARY

In one embodiment, a system transmits data frames from a transmitter to a receiver over a channel. The system uses signal modulation to increase data transfer rates. For example, Pulse Amplitude Modulation (PAM), which divides an analog signal into a finite number of levels, each associated with a digital value, such as four level PAM modulation (PAM4). When decoding symbols at the receiver, there is a chance for error due to interference. A Decision Based Filter (DBF) may be used on the analog signal to reduce the probability of error. In order to operate correctly, the DBF may require information regarding the type of modulation and values of the symbols entering the receiver, for example slicing results based on PAM4 or PAM8 modulations. Optionally, the DBF performances may be further improved using slicing error associated with the slicing results.

In some embodiments, the receiver includes an Analog Front End (AFE), a DBF, a slicer, and a Physical Coding Sublayer (PCS). The AFE receives the analog signals. The slicer coverts the analog signal, received from the AFE into slicing results, which are digital representations of the symbols, using an appropriate slicing function. The slicing results are fed to a PCS, which parses the data frames and extracts information such as frame headers, frame tail, frame payload and frame modulation information. The PCS may determine the modulation used and indicate the slicer of which slicing function to use. The slicer may then provide the slicing results from the indicated slicer to the DBF. Optionally, the slicer may additionally provide slicing errors associated with the slicing results, for example a one-bit symbol indicating whether the analog level of the symbol is below or above the slicing level. Then the DBF generates the appropriate output and adds it to the incoming analog signal from the AFE.

BRIEF DESCRIPTION OF THE DRAWINGS

The embodiments are herein described, by way of example only, with reference to the accompanying drawings. In the drawings.

DETAILED DESCRIPTION

Figure 1:
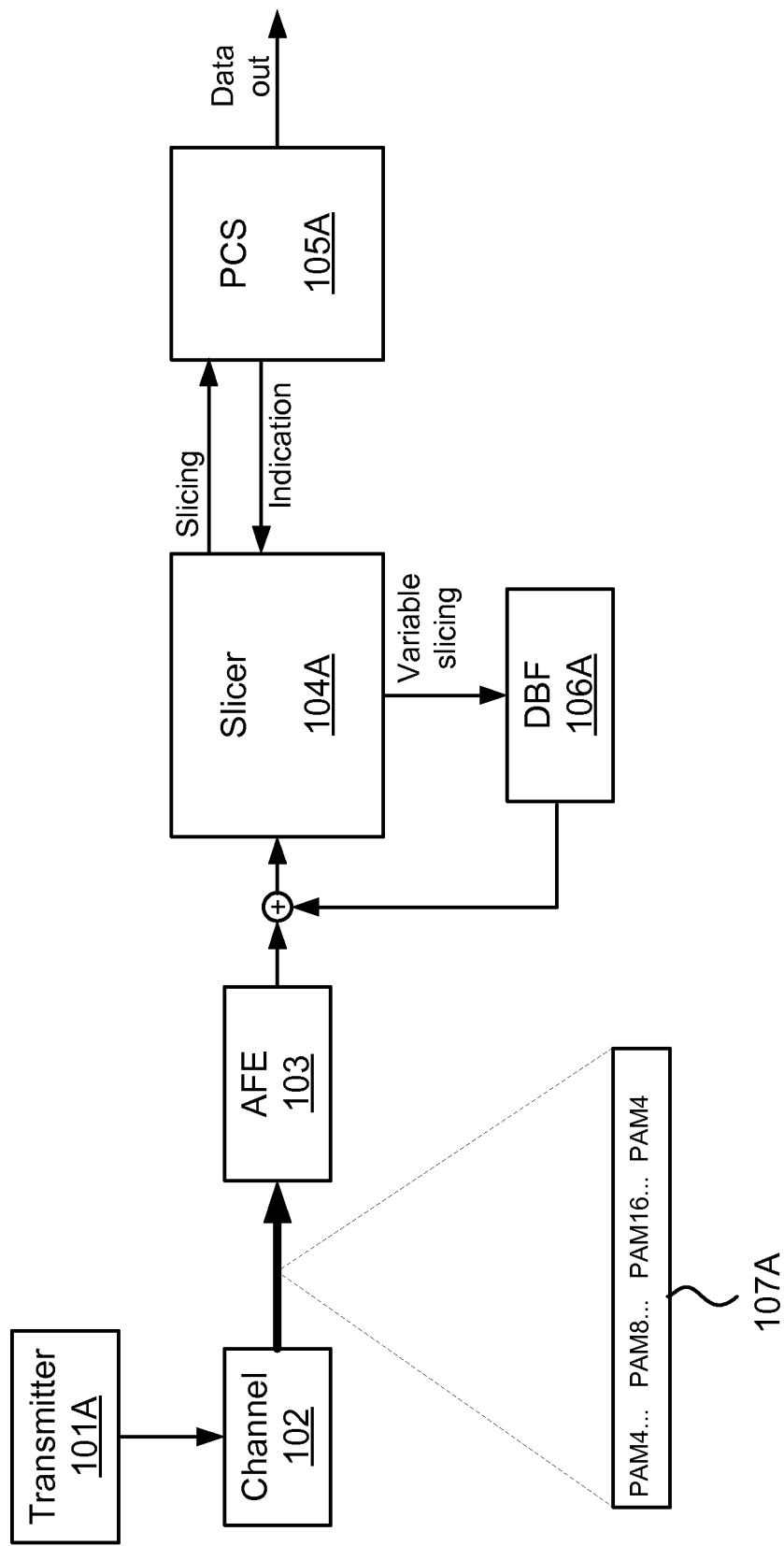
FIG. 1 illustrates one embodiment of a system for sending and receiving frames.

In the following description, numerous specific details are set forth. However, the embodiments of the invention may be practiced without some of these specific details. In other instances, well-known hardware, software, materials, structures and techniques have not been shown in detail in order not to obscure the understanding of this description. In this description, references to "one embodiment" or "an embodiment" mean that the feature being referred to may be included in at least one embodiment of the invention. Moreover, separate references to "one embodiment" in this description do not necessarily refer to the same embodiment. Illustrated embodiments are not mutually exclusive, unless so stated and except as will be readily apparent to those of ordinary skill in the art. Thus, the invention may include any variety of combinations and/or integrations of the embodiments described herein. Also herein, flow diagrams illustrate non-limiting embodiment examples of the methods, and block diagrams illustrate non-limiting embodiment examples of the devices. Some operations in the flow diagrams may be described with reference to the embodiments illustrated by the block diagrams. However, the methods of the flow diagrams could be performed by embodiments of the invention other than those discussed with reference to the block diagrams, and embodiments discussed with reference to the block diagrams could perform operations different from those discussed with reference to the flow diagrams. Moreover, although the flow diagrams may depict serial operations, certain embodiments could perform certain operations in parallel and/or in different orders from those depicted. Moreover, the use of repeated reference numerals and/or letters in the text and/or drawings is for the purpose of simplicity and clarity and does not in itself dictate a relationship between the various embodiments and/or configurations discussed. Furthermore, methods and mechanisms of the embodiments will sometimes be described in singular form for clarity. However, it should be noted that some embodiments may include multiple iterations of a method or multiple instantiations of a mechanism unless noted otherwise. For example, when a controller or an interface are disclosed in an embodiment, the scope of the embodiment is intended to also cover the use of multiple controllers or interfaces.

The term "slicer function" is defined as one or more dimensional quantizer that outputs the quantization result and optionally the error between the received signal and the quantization result.

The term "decision based filter" (DBF) is defined as a filter fed by a slicer function output. In one example, the DBF is a non-adaptive Decision Feedback Equalizer (DFE), or a non-adaptive FEXT canceller, fed by the slicing results. In another example, the DBF is an adaptive DFE, or an adaptive FEXT canceller, fed by the slicing results and the slicing errors. In still another example, the DBF is an adaptive Feed-Forward Equalizer (FFE) fed by the slicing errors for adaptation purpose.

In some embodiments, a receiver for packets comprising symbols of at least two different modulations in the same packet, includes a fine slicer and a dynamic slicer. The fine slicer slices the symbols using all of the symbol-set levels and provides the slicing error, which may include only the direction of the error (i.e. one-bit error). The dynamic slicer slices the symbols based on the symbols' estimated modulations. In other words, the dynamic slicer, which belongs to the physical layer and therefore is unaware of the proper required modulation, receives feedback from the coding layer, which is able to determine the proper required modulation. Thus, as long as the estimated modulation is accurate, the dynamic slicer provides accurate results with the shortest delay. However, when the estimated modulation is inaccurate, the dynamic slicer provides false results.

In some embodiments, the packet includes the following fields: header, packet type defining the payload modulations, payload length, payload data, and CRC. In one example, the Physical Coding Sublayer (PCS) features a processing delay that prevents it from adjusting the slicer to the proper packet type before the payload is received. Because the processing delay of the PCS is known, and to be able to use such a PCS with a dynamic slicer, the first few symbols and/or bytes of the payload are modulated with a predetermined modulation scheme that is used until the commands from the PCS are received by the slicer. FIG. 1 illustrates one example of a frame 107A containing payload having a few initial bytes modulated with a predetermined modulation (PAM4), then the following bytes are modulated according to the data (PAM8 and PAM16), and then the tail is modulated again with the predetermined modulation (PAM4). This initial a priori modulation pattern enables a PCS having a delay longer than the time between the packet type and the payload to control a dynamic slicer.

As explained above, although the slicer may slice the symbols according to all possible modulations in parallel, it is desirable to forward to a DBF the most accurate results, meaning that the right modulation has to be known as fast as possible.

In some embodiments, a receiver comprises a slicer, a Physical Coding Sublayer (PCS), and a Decision Based Filter (DBF). The receiver receives frames including symbols of at least two different modulation orders that use subsets of a symbol superset that essentially equals the highest modulation order. The slicer operates slicing functions suitable for the different modulations, and feeds the PCS with slicing results of the slicer suitable for the highest modulation order. The PCS identifies frame boundaries and modulation information, which are modulated according to a predetermined modulation order. The PCS further uses the identified modulation information to determine the modulation of a nonempty set of dynamically modulated symbols in each frame, and provides the slicer with an indication of which slicer function output to use to feed the DBF.

FIG. 1 illustrates one embodiment of a system for sending and receiving frames 107A. For example, a frame may include audio, video, messaging, and general data. The system includes a transmitter 101A, a channel 102, and a receiver. The receiver includes an Analog Front End (AFE) 103, a slicer 104A, a PCS 105A, and a DBF 106A. The frames 107A include symbols of at least two different modulation orders that use subsets of a symbol superset that essentially equals the highest modulation order. In the claims, sentences such as "wherein the different modulations use subsets of the same symbol superset that essentially equal the highest modulation order" mean that the superset may essentially consist of the levels of the highest symbol set, or the superset may comprise the levels of the highest symbol set in addition to few more levels used by one or more of the other modulations, where the few more level are less than a quarter of the total levels.

The slicer 104A has slicing functions suitable for the different modulations and feeds the PCS 105A with slicing results of the slicer 104A suitable for the highest modulation order. For example, slicer 104A may have PAM4, PAM8, and PAM16 slicing functions and may feed the PCS 105A with PAM16 slicing results. The PCS 105A identifies the frame boundaries and modulation information based on their predetermined modulation order.

The PCS 105A further uses the identified modulation information to determine the modulation of a nonempty set of dynamically modulated symbols in each frame, and provides the slicer 104A with an indication of which slicer function output to use to feed the DBF 106A. For example, the modulation may be PAM4, PAM8, or PAM16. The PCS 105A identifies the modulation information, reads the modulation information, and indicates to the slicer 104A, to use PAM8 modulation. The DBF 106A outputs an analog signal, which is summed with the signal output of the AFE 103, before entering the slicer 104A.

Optionally, the slicer function output includes the slicing results of the indicated slicer function. Optionally, the slicer function output includes slicing errors of the indicated slicer function, and the DBF 106A uses the slicing error to adapt filter coefficients that feed the slicer 104A. Optionally, the slicing error consists of direction of the slicing error. In one example, the slicing error may be a one-bit signal indicating the value "0" when the slicing result is below the slicing function level and the value "1" when the slicing result is above the slicing function level. Optionally, the PCS 105A further uses the slicing error to correct the slicing result. Optionally, the DBF 106A improves signal-to-noise-ratio at the slicer 104A input based on the feeding from the slicer to the DBF 106A. Optionally, the nonempty set of dynamically modulated symbols includes at least a quarter of the received symbols associated with the received frames. For example, a frame may include a header followed by 256 dynamically modulated symbols. Optionally, the PCS 105A features a delay longer than the time between receiving the modulation information and receiving the first dynamically modulated symbol, and the slicer 104A feeds a DBF 106A with the predetermined modulation order results until the slicer 104A receives the indication of which slicer function output to use to feed the DBF 106A.

Optionally, the receiver communicates with a transmitter 101A that dynamically modulates at least some of the symbols associated with the frame payload based on the type of data conveyed by each symbol. For example, the transmitter 101A modulates the first three payload symbols of each frame using PAM4 modulation and then modulates the rest of the payload symbols according to their data types. Optionally, the transmitter 101A is further configured to modulate the dynamically modulated symbols based on properties of the channel 102 to the receiver. For example, the transmitter modulates the dynamically modulated symbols using PAM16 when the distance between the transmitter 101A and the receiver is short, and PAM8 when the distance between the transmitter 101A and the receiver is long. Optionally, the transmitter 101A achieves source coding by selecting different modulations for different symbols based on the symbols' data types. For example, the transmitter 101A modulates video data using PAM16, and control data using PAM4. Optionally, the receiver communicates with a transmitter 101A that modulates idle time and the frame boundaries according to the predetermined modulation, and modulates the dynamically modulated symbols based on type of data conveyed by each symbol. For example, the transmitter 101A modulates idle time and the frame boundaries using PAM4, and dynamically modulates symbols containing control data using PAM8. Optionally, the frame boundaries include a frame tail, and the slicer 104A feeds the PCS 105A with the slicing of the frame tail according to the predetermined modulation. For example, the slicer 104A feeds the PCS with PAM4 tail symbols.

Optionally, after receiving the indication of which slicer function output to use to feed the DBF, the slicer 104A provides the PCS with the slicer function according to the indication received from the PCS 105A. Optionally, most of the time the slicer 104A feeds the PCS 105A with the slicing results of the slicer suitable for the highest modulation order. In the claims, most of the time is to be interpreted as more than 50% of the time. In some cases, most of the time is to be interpreted as more than 90% of the time.

Optionally, the frame boundaries include a frame header and frame tail, and the modulation information is a field located at one of the frame boundaries. Optionally, the modulation information field describes the modulations of the dynamically modulated symbols as function of the symbol locations in the frame. Optionally, a substantial amount of the modulation information is located at the frame header and the modulation information describes the symbol modulations as function of the symbol locations at the current frame and symbol locations in at least one following frame. Optionally, the frame header stores modulation information describing the symbol modulations as function of the symbol locations at the current frame, and the frame tail stores information modulation describing the symbol modulations as function of the symbol locations in at least one following frame.

In one embodiment, a receiver includes an AFE coupled to a slicer that receives symbols of at least two different modulations. The different modulations use subsets of the same symbol superset that essentially equals the highest modulation order. At least some of the symbols are associated with a frame payload and are dynamically modulated. The slicer fine slices the symbols using the superset levels, and feeds the fine slicing results and corresponding slicing errors to a PCS. The PCS uses the fine slicing results and errors to identify the frame, extracts data describing the symbol modulations as function of the symbol locations in the frame, and feeds the slicer with the extracted symbol modulations. Then, the slicer slices the remaining symbols in the frame payload according to the extracted symbol modulations and feeds a DBF and the PCS with the result.

Figure 2:
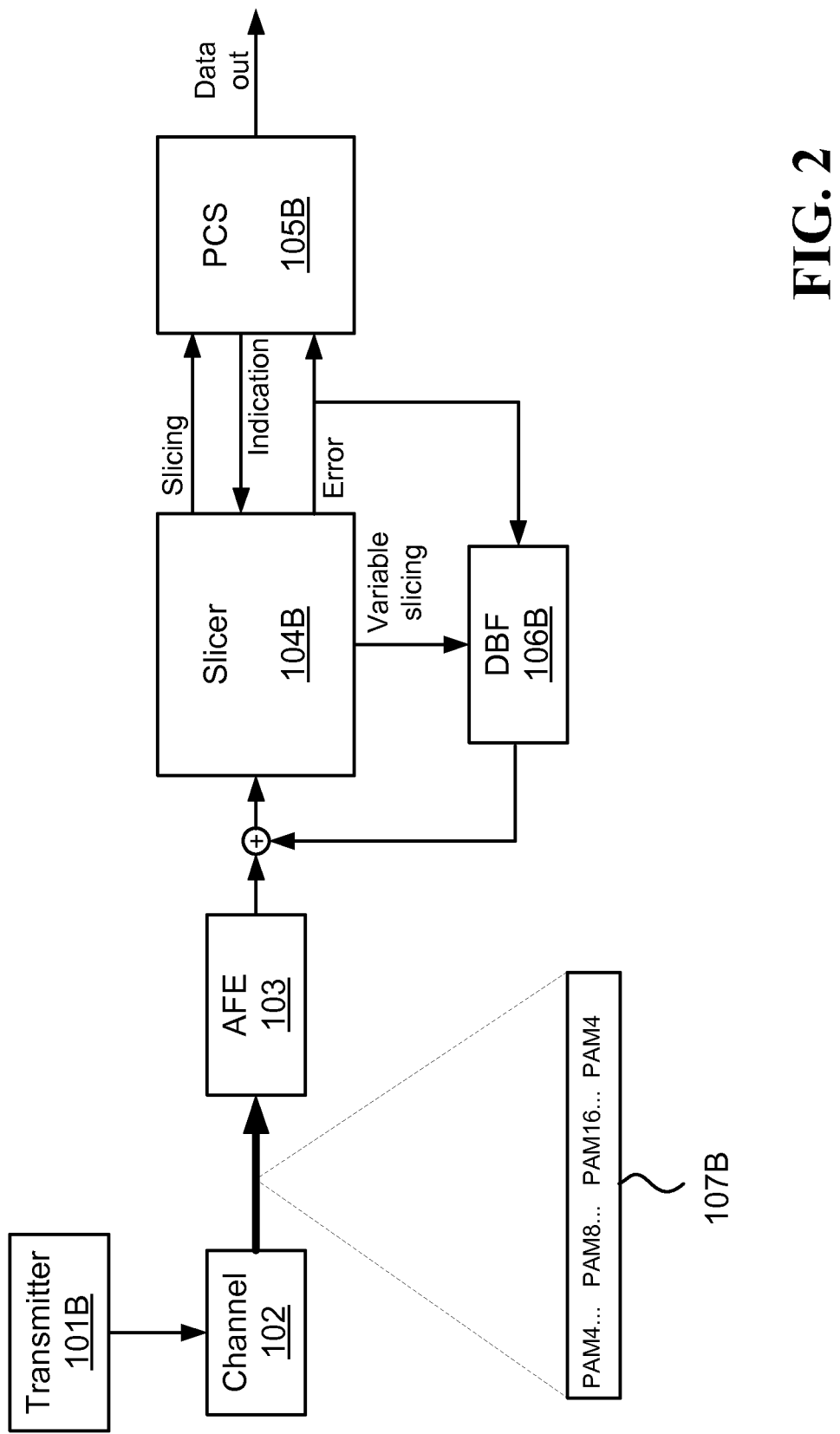
FIG. 2 illustrates one embodiment of a system for sending and receiving frames.

FIG. 2 illustrates one embodiment of a system for sending and receiving frames 107B. The system includes a transmitter 101B, a channel 102, and a receiver. The receiver includes an AFE 103, a slicer 104B, a PCS 105B, and a DBF 106B. The receiver receives symbols of at least two different modulations, where the different modulations are subsets of the same symbol superset that essentially equals the highest modulation order. At least some of the symbols are associated with a frame payload and are dynamically modulated. The slicer 104B fine slices the symbols using the superset levels, and feeds the fine slicing results and corresponding slicing errors to a PCS 105B. For example, slicer 104B may use a PAM16 slicing function for each slicing result, may feed the PCS 105B with a 4 bit value slicing result, and a 1 bit value indicating the corresponding slicing error. The PCS 105B uses the fine slicing results and errors to identify the frame, extract data describing the symbol modulations as function of the symbol locations in the frame, and feed the slicer 104B with the extracted symbol modulations. For example, PCS 105B may use PAM16 slicing results and slicing errors to extract data indicating that the frame payload size is 256 symbols, and symbols starting with a predefined symbol after the header may be dynamically modulated. Then, the slicer 104B slices the remaining symbols in the frame payload according to the extracted symbol modulations, and feeds a DBF 106B and the PCS 105B with the result. For example, the slicer 104B, may fine slice the first three symbols of the payload using PAM4 slicing function, then continuing with the fourth symbol using PAM8 slicing function. Starting with the fourth symbol of the payload, the slicer 104B may feed the PCS 105B with PAM8 slicing results and slicing errors, and feeds DBF 106B with PAM8 slicing results.

Optionally, the PCS 105B provides improved slicing results based on the fine slicing results and corresponding slicing errors. Optionally, after receiving the extracted symbol modulations, the slicer 104B provides the PCS 105B with the slicer function according to the extracted symbol modulations received from the PCS. For example, a slicer 104B begins fine slicing symbols in a frame using PAM16. The PCS 105B extracts data indicating that the first three symbols after the header are modulated using PAM4 and sends the modulation to the slicer 104B. The slicer 104B then provides the PCS 105B with PAM4 slicing results until the fourth symbol is reached.

Optionally, more than 50% of the time, the slicer 104B feeds the PCS 105B with the fine slicing results, and the PCS 105B checks the modulation also after extracting the data describing the symbol modulations as function of the symbol locations in the frame 107B in order to correct a possible cumulative error. Optionally, more than 90% of the time the slicer 104B feeds the PCS 105B with the fine slicing results, and the PCS 105B checks the modulation also after extracting the data describing the symbol modulations as function of the symbol locations in the frame 107B in order to correct a possible cumulative error.

Figure 3:
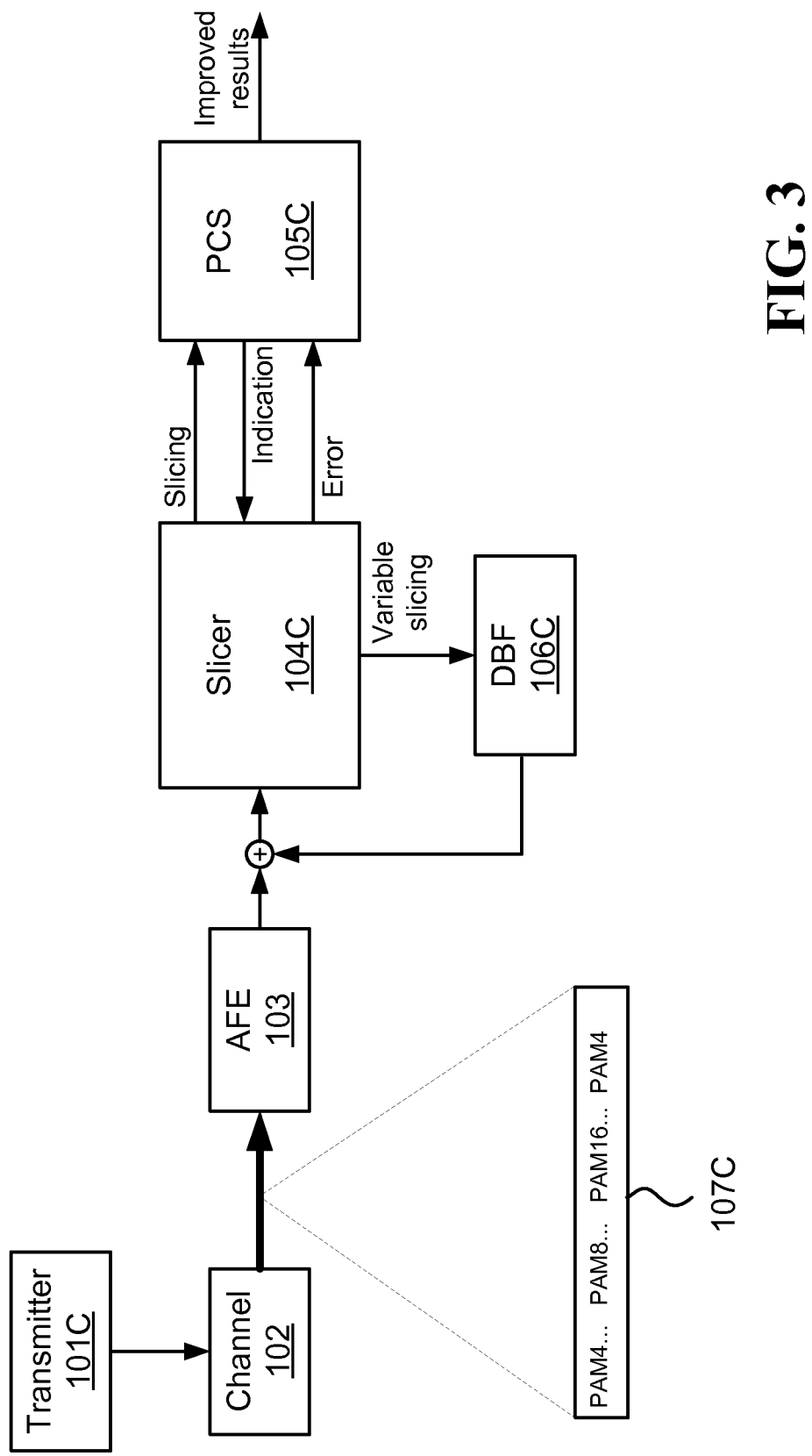
FIG. 3 illustrates one embodiment of a system for sending and receiving frames.

FIG. 3 illustrates one embodiment of a system for sending and receiving frames 107C. The system includes a transmitter 101C, a channel 102, and a receiver. The receiver includes an AFE 103, a slicer 104C, a PCS 105C, and a DBF 106C. The receiver receives symbols of at least two different modulations. The different modulations use subsets of the same symbol superset that essentially equals the highest modulation order. At least some of the symbols are associated with a frame payload and are dynamically modulated. The slicer 104C fine slices the symbols using the superset levels, and feeds the fine slicing results and corresponding slicing errors to a PCS 105C. The PCS 105C uses the fine slicing results and errors to identify the frame, extracts data describing at least some of the symbol modulations as function of the symbol locations in the frame, provides improved slicing results based on the extracted symbol modulations, and feeds the slicer 104C with the extracted symbol modulations. The slicer 104C further slices at least a quarter of the received symbols, which are associated with the frame, according to the extracted symbol modulations, and feeds a DBF with the result.

Optionally, the receiver communicates with a transmitter 101C that dynamically modulates the at least some of the symbols associated with the frame payload based on type of data conveyed by each symbol. Optionally, the receiver communicates with a transmitter that achieves source coding by selecting different modulations for different symbols based on the symbols' data types. Optionally, the slicing errors consist of the direction of the slicing error. Optionally, the header of the frame 107C stores the data describing the symbol modulations as a function of the symbol locations in the frame 107C. Optionally, the header of the frame 107C stores the data describing the symbol modulations as a function of the symbol locations in the current frame and symbol locations in at least one following frame. Optionally, the header of the frame 107C, stores the data describing the symbol modulations as a function of the symbol locations in the frame 107C, and the frame's tail stores the data describing the symbol modulations as function of the symbol locations in at least one following frame 107C.

Figure 4:
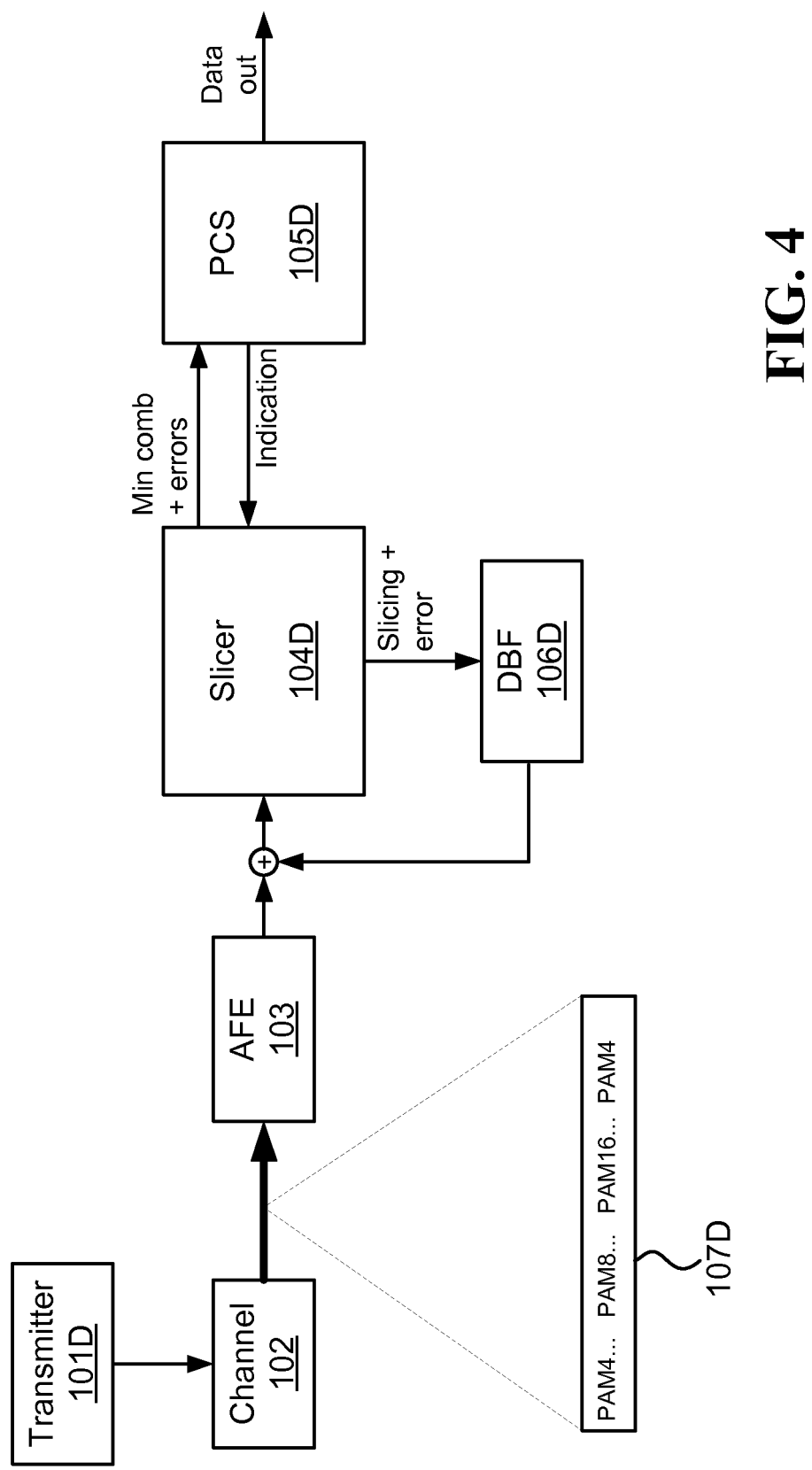
FIG. 4 illustrates one embodiment of a system for sending and receiving frames.

FIG. 4 illustrates one embodiment of a system for sending and receiving frames 107D. The system includes a transmitter 101D, a channel 102, and a receiver. The receiver includes an AFE 103, a slicer 104D, a PCS 105D, and a DBF 106D. Each of most of the received frames includes modulation information modulated according to a predetermined modulation order, and symbols of at least two different modulation orders that are dynamically modulated in accordance with the modulation information.

The slicer 104D feeds the PCS 105D with essentially the minimal combination of slicing results that essentially covers all the modulation orders. The PCS 105D identifies the modulation information, uses the identified modulation information to determine the modulation of the dynamically modulated symbols, and provides the slicer 104D with an indication of which slicer function output to use to feed the DBF 106D.

In some embodiments, the slicer includes combined slicing function that produces essentially the minimal combination of slicing results that essentially covers all the modulation orders. In one case, essentially is greater than 80%. In another embodiment, all modulations are subsets of the highest modulation order of the symbols, and therefore the minimal combination of slicing results equals the highest modulation order of the symbols. Optionally, the dynamically modulated symbols include at least a quarter of the received symbols associated with frames 107D. Optionally, after receiving the indication of which slicer function to use, the slicer 104D provides the PCS 105D with the slicing results according to the indication of which slicing function to use, received from the PCS 105D. Optionally, more than 50% of the time the slicer 104D feeds the PCS 105D with the slicing results of the slicing function suitable for the highest modulation order. Optionally, more than 90% of the time the slicer 104D feeds the PCS 105D with the slicing results of the slicing function suitable for the highest modulation order.

Optionally, the slicer further feeds the DBF with slicing error of the indicated slicer function, and the DBF further uses the slicing error to adapt filter coefficients that feed the slicer. Optionally, the PCS further uses the slicing error to correct the slicing result. Optionally, the DBF improves signal-to-noise-ratio at the slicer input based on the feeding from the slicer to the DBF. Optionally, the dynamically modulated symbols include at least a quarter of the received symbols associated with the received frames.

Figure 5A:
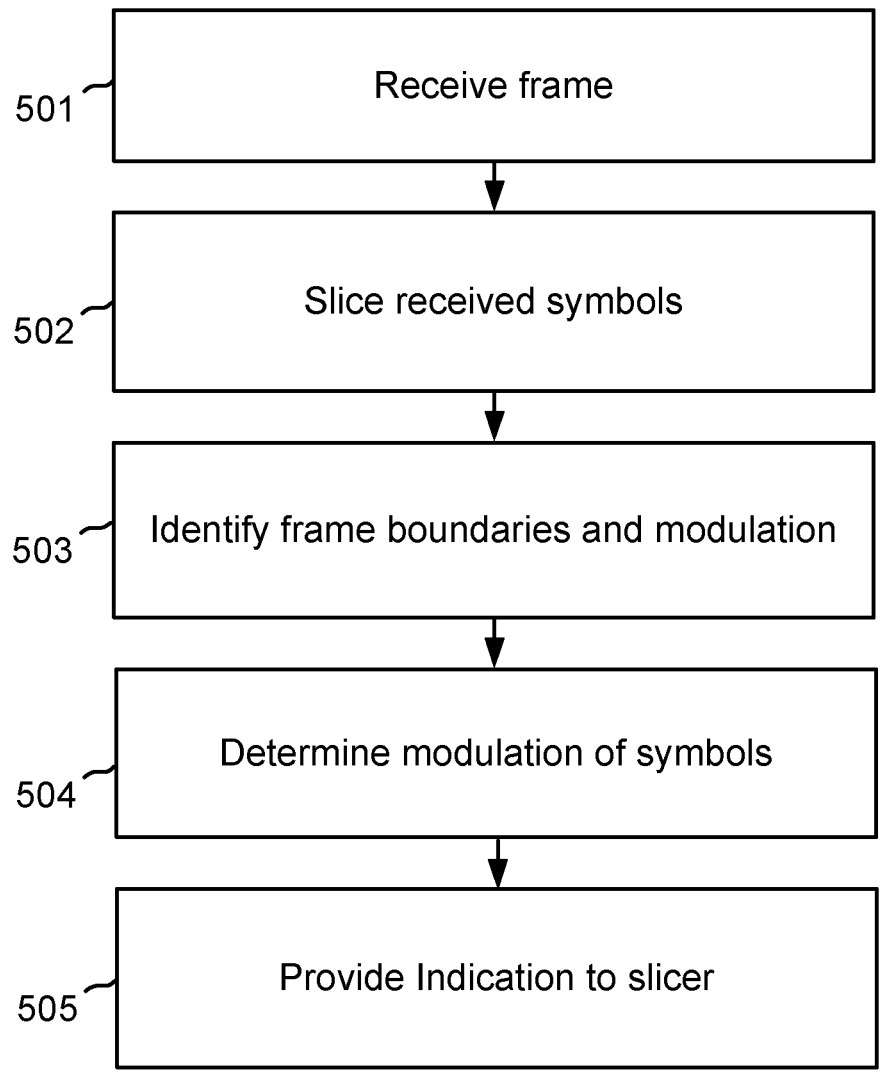
FIG. 5A is a flow diagram illustrating a method for reducing error propagation.

FIG. 5A is a flow diagram illustrating a method for reducing error propagation, including the following steps: In step 501, receiving a frame comprising symbols of at least two different modulation orders that use subsets of a symbol superset that essentially equals the highest modulation order. In step 502, slicing the received symbols according to the highest modulation order by a slicer having slicing functions suitable for the different modulations. In step 503, identifying by a PCS frame boundaries, which are modulated according to a predetermined modulation order, and identifying the modulation information. In step 504, using the identified modulation information for determining the modulation of a nonempty set of dynamically modulated symbols in the received frame. And in step 505, providing the slicer with an indication of which slicer function output to use for feeding a DBF. The method further comprising the following optional steps. Optionally, feeding the DBF with slicing error of the indicated slicer function, and using the slicing error for adapting filter coefficients that feed the slicer. Optionally, the slicing error consists direction of the slicing error, and further providing by the PCS an improved slicing result based on the slicing error. Optionally, further improving signal-to-noise-ratio at the slicer input based on the feeding from the slicer to the DBF. Optionally, the PCS features a delay longer than the time between receiving the modulation information and receiving the first dynamically modulated symbol, and further feeding the DBF with the predetermined modulation order results until the slicer receives the indication of which slicer function output to use to feed the DBF. Optionally, a transmitter dynamically modulates at least some of the symbols associated with the frame payload based on the type of data conveyed by each symbol. Optionally, modulating the dynamically modulated symbols based on channel properties. Optionally, achieving source coding by selecting different modulations for different symbols based on the symbols' data types. Optionally, a transmitter modulates idle time and the frame boundaries according to the predetermined modulation, and modulates the dynamically modulated symbols based on type of data conveyed by each symbol. Optionally, the frame boundaries include a frame tail, and the slicer feeds the PCS with the slicing results of the frame tail according to the predetermined modulation. Optionally, after receiving the indication of which slicer function output to use to feed the DBF, further providing the PCS with the slicer function according to the indication received from the PCS. Optionally, most of the time the slicer feeds the PCS with the slicing results of the slicer suitable for the highest modulation order. Optionally, after identifying the modulation information, the PCS checks the modulation in order to correct a possible cumulative error.

Figure 5B:
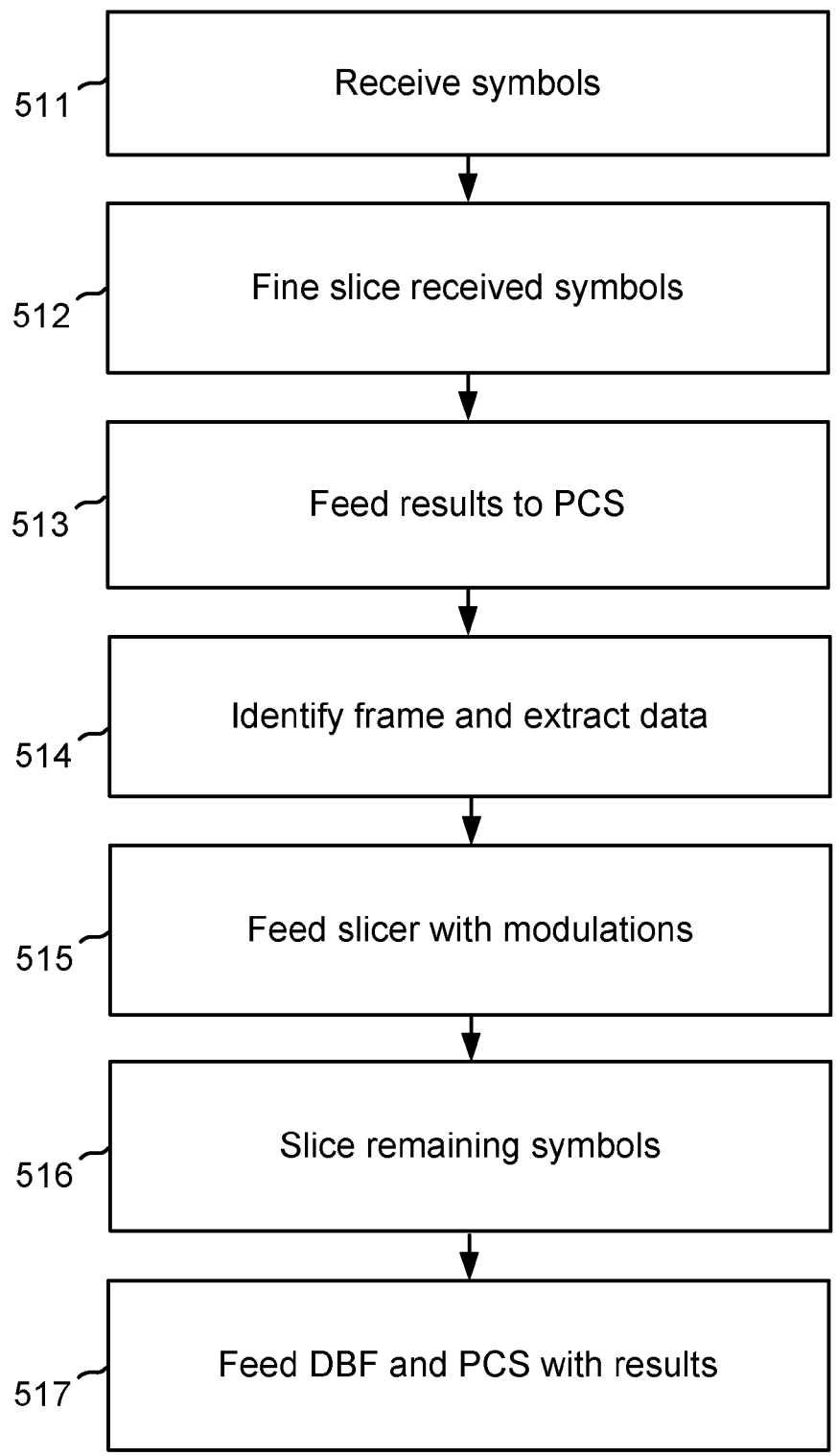
FIG. 5B is a flow diagram illustrating a method for processing frames.

FIG. 5B is a flow diagram illustrating a method for processing frames, including the following steps: In step 511, receiving symbols of at least two different modulations by a slicer. The different modulations use subsets of the same symbol superset that essentially equals the highest modulation order, and at least some of the symbols are associated with a frame payload and are dynamically modulated. In step 512, fine slicing the received symbols using the superset levels. In step 513, feeding the fine slicing results and corresponding slicing errors to a PCS. In step 514, using the fine slicing results and errors for identifying the frame, and for extracting data describing the symbol modulations as function of the symbol locations in the frame. In step 515, feeding the slicer with the extracted symbol modulations. In step 516, slicing the remaining symbols in the frame payload according to the extracted symbol modulations. And in step 517, feeding a DBF and the PCS with the result.

Figure 5C:
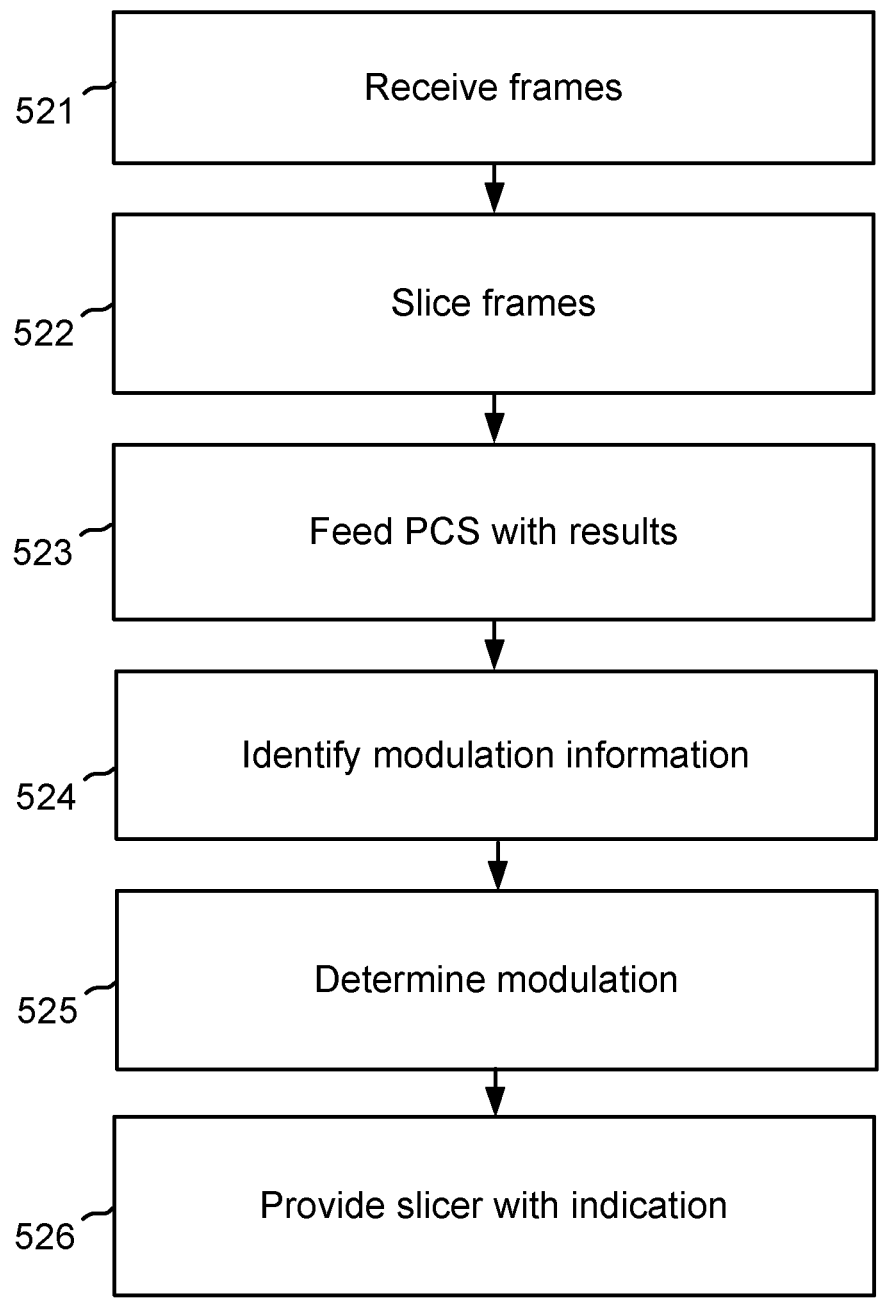
FIG. 5C is a flow diagram illustrating a method for processing frames and reducing error propagation.

FIG. 5C is a flow diagram illustrating a method for processing frames and reducing error propagation, including the following steps: In step 521, receiving frames, wherein each of most of the frames includes modulation information modulated according to a predetermined modulation order, and symbols of at least two different modulation orders that are dynamically modulated in accordance with the modulation information. In step 522, slicing the frames with essentially minimal combination slicing function that essentially covers all the modulation orders. In step 523, feeding a PCS with the results from the minimal combination slicing function. In step 524, identifying the modulation information by the PCS. In step 525, using the identified modulation information for determining the modulation of the dynamically modulated symbols. And in step 526, providing the slicer with an indication of which slicer function output to use to feed a DBF. Optionally, the transmitter modulates idle time according to the predetermined modulation, and modulates the dynamically modulated symbols based on the type of data conveyed by each symbol. Optionally, most of the time the slicer feeds the PCS with the slicing results of the slicer suitable for the highest modulation order.

Figure 5D:
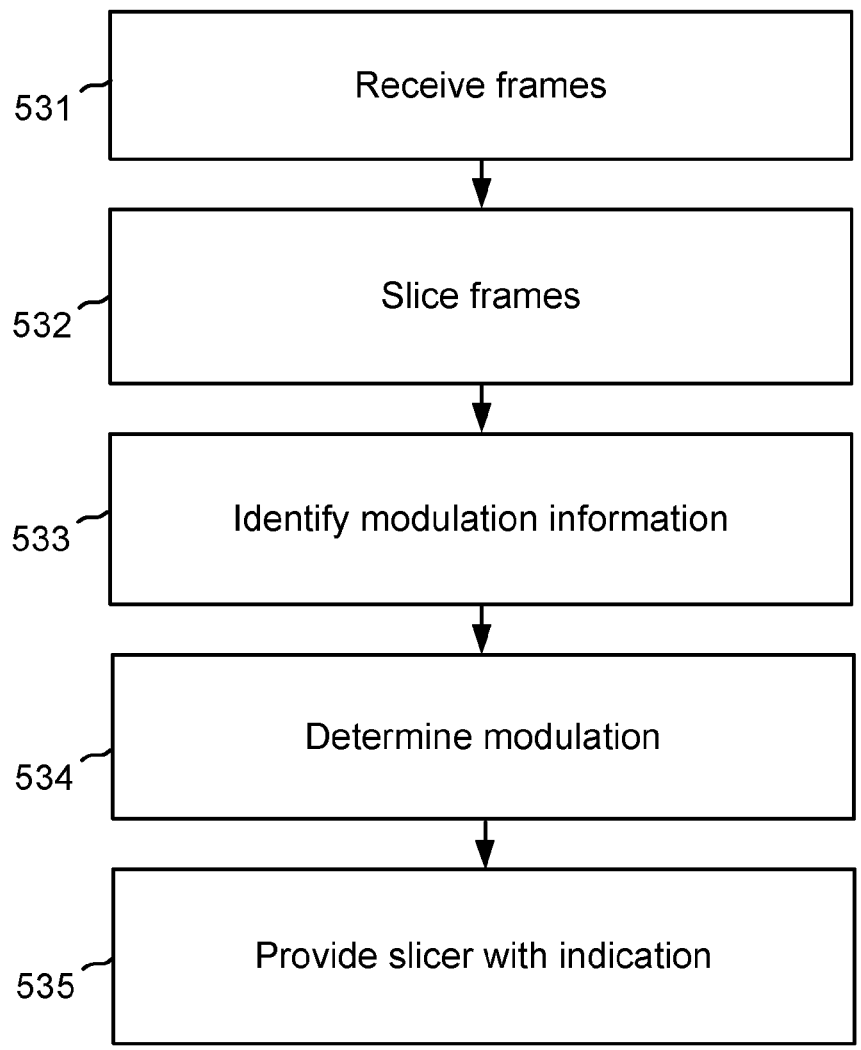
FIG. 5D is a flow diagram illustrating a method for processing frames.

FIG. 5D is a flow diagram illustrating a method for processing frames, including the following steps: In step 531, receiving frames, each of most of the frames includes modulation information modulated according to a predetermined modulation order, and symbols of at least two different modulation orders that are dynamically modulated in accordance with the modulation information. In step 532, slicing the received symbols according to the predetermined modulation order by a slicer having slicing functions suitable for the different modulations. In step 533, identifying by a PCS the modulation information of the dynamically modulated symbols. In step 534, using the identified modulation information for determining the modulation of a nonempty set of dynamically modulated symbols in the received frame. In step 535, providing the slicer with an indication of which slicer function output to use to feed a DBF.

Figure 6A:
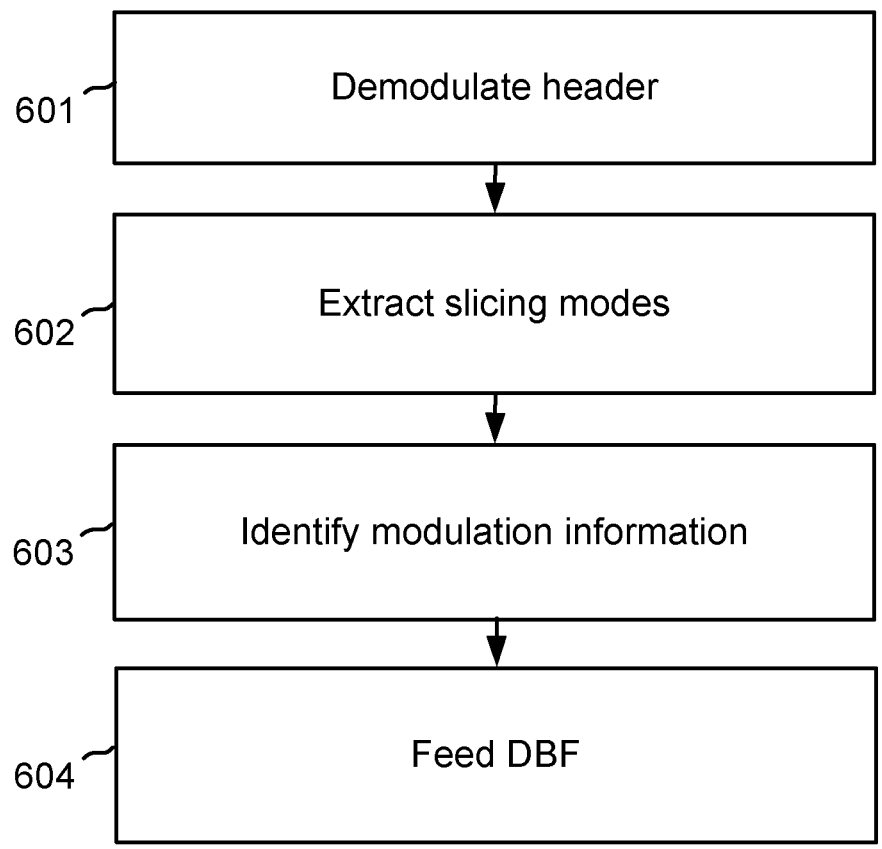
FIG. 6A is a flow diagram illustrating a method for reducing error propagation during processing of a received frame comprising variable symbol-modulation.

FIG. 6A is a flow diagram illustrating a method for reducing error propagation during processing of a received frame comprising variable symbol-modulation, the method including the following steps: In step 601, demodulating the header of the received frame using a first predetermined slicing mode. In step 602, extracting from the received header the proper slicing modes for slicing the frame's payload. In step 603, based on the proper slicing modes, slicing at least some of the payload symbols using a second slicing mode. And in step 604, feeding a DBF with the at least some of the payload symbols. Optionally, based on the proper slicing modes, slicing at least some of the remaining payload symbols using a third slicing mode. And optionally, having a feedback loop by feeding the slicer with the DBF output.

Figure 6B:
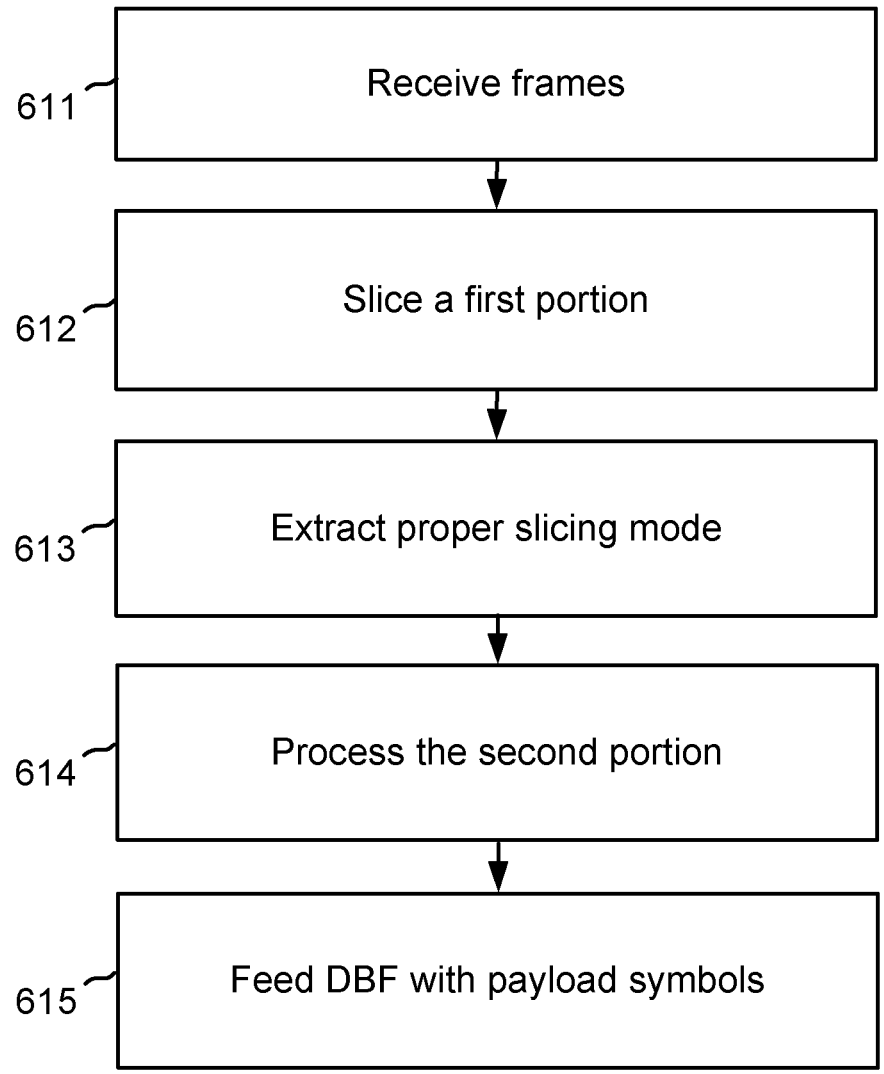
FIG. 6B is a flow diagram illustrating a method for reducing error propagation during reception and processing of a received frame.

FIG. 6B is a flow diagram illustrating a method for reducing error propagation during reception and processing of a received frame, the method including the following steps: In step 611, receiving by a receiver a frame comprising symbols. In step 612, slicing by a slicer a first portion of the symbols using a first predetermined slicing mode. In step 613, extracting from the first portion of the symbols the proper slicing mode for a second portion of the frame payload comprising dynamically modulated symbols. In step 614, processing the second portion symbols using the proper slicing mode. And in step 615, feeding a DBF with the at least some of the payload symbols.

Certain features of the embodiments, which may have been, for clarity, described in the context of separate embodiments, may also be provided in various combinations in a single embodiment. Conversely, various features of the embodiments, which may have been, for brevity, described in the context of a single embodiment, may also be provided separately or in any suitable sub-combination.

The embodiments are not limited in their applications to the details of the order or sequence of steps of operation of methods, or to details of implementation of devices, set in the description, drawings, or examples.

While the methods disclosed herein have been described and shown with reference to particular steps performed in a particular order, it will be understood that these steps may be combined, sub-divided, or reordered to form an equivalent method without departing from the teachings of the embodiments. Accordingly, unless specifically indicated herein, the order and grouping of the steps is not a limitation of the embodiments.

While the embodiments have been described in conjunction with specific examples thereof, it is to be understood that they have been presented by way of example, and not limitation. Moreover, it is evident that many alternatives, modifications and variations will be apparent to those skilled in the art. Accordingly, it is intended to embrace all such alternatives, modifications and variations that fall within the spirit and scope of the appended claims and their equivalents.

What is claimed is:

1. A receiver configured to receive frames, comprising:
a slicer, a physical coding sublayer (PCS), and a decision based filter (DBF);
the frames comprising symbols of at least two different modulation orders that use subsets of a symbol superset that essentially equals highest modulation order;
the slicer configured to have slicing functions suitable for the different modulation orders and to feed the PCS with slicing results of the slicer suitable for the highest modulation order;
the PCS configured to identify frame boundaries and modulation information, which are modulated according to a predetermined modulation order; and
the PCS is further configured to use the identified modulation information to determine the modulation of a nonempty set of dynamically modulated symbols in each frame, and to provide the slicer with an indication of which slicer function output to use to feed the DBF.

2. The receiver of claim 1, wherein the slicer function output comprises the slicing results of the indicated slicer function.

3. The receiver of claim 1, wherein the slicer function output comprises slicing errors of the indicated slicer function, and the DBF is further configured to use the slicing error to adapt filter coefficients that feed the slicer.

4. The receiver of claim 3, wherein the slicing error consists of direction of the slicing error.

5. The receiver of claim 3, wherein the PCS further configured to use the slicing error to correct the slicing result.

6. The receiver of claim 1, wherein the DBF configured to improve signal-to-noise-ratio at the slicer's input based on the feeding from the slicer to the DBF.

7. The receiver of claim 6, wherein the PCS operative to have a delay longer than time between receiving the modulation information and receiving a first dynamically modulated symbol; and the slicer is further configured to feed the DBF with the predetermined modulation order results until the slicer receives the indication of which slicer function output to use to feed the DBF.

8. The receiver of claim 1, wherein the receiver communicates with a transmitter configured to modulate idle time and the frame boundaries according to the predetermined modulation, and modulate the dynamically modulated symbols based on type of data conveyed by each symbol.

9. The receiver of claim 1, wherein after receiving the indication of which slicer function output to use to feed the DBF, the slicer configured to provide the PCS with the slicer function according to the indication received from the PCS.

10. The receiver of claim 1, wherein the frame boundaries comprise frame header and frame tail, and the modulation information is a field located at one of the frame boundaries.

11. The receiver of claim 10, wherein the modulation information field describes the modulations of the dynamically modulated symbols as function of the symbol locations in the frame.

12. The receiver of claim 1, wherein the frame boundaries comprise frame header and frame tail, and a substantial amount of the modulation information is located at the frame header and describes the symbol modulations as function of locations of the symbol at current frame and locations of the symbol in at least one following frame.

13. The receiver of claim 1, wherein the frame boundaries comprise frame header and frame tail; the frame header stores modulation information describing the symbol modulations as function of locations of the symbol at current frame; and the frame tail stores information modulation describing the symbol modulations as function of the symbol locations in at least one following frame.

14. A receiver comprising:
a slicer configured to receive symbols of at least two different modulations;
the different modulations use subsets of same symbol superset that essentially equals highest modulation order;
at least some of the symbols are associated with a payload of a frame and are dynamically modulated;
the slicer further configured to fine slice the symbols using the symbol superset, and feed the fine slicing results and corresponding slicing errors to a physical coding sublayer (PCS);
the PCS configured to use the fine slicing results and the slicing errors to identify the frame, extract data describing the symbol modulations as function of symbol locations in the frame, and feed the slicer with the extracted symbol modulations;
then, the slicer further configured to slice the remaining symbols in the payload according to the extracted symbol modulations and feed a Decision Based Filter (DBF) and the PCS with the result.

15. The receiver of claim 14, wherein the PCS is further configured to provide improved slicing results based on the fine slicing results and the corresponding slicing errors.

16. The receiver of claim 14, wherein after receiving the extracted symbol modulations, the slicer configured to provide the PCS with the slicer function according to the extracted symbol modulations received from the PCS.

17. The receiver of claim 14, wherein most of the time the slicer feeds the PCS with the fine slicing results, and the PCS checks the modulation also after extracting the data describing the symbol modulations as function of the symbol locations in the frame in order to correct a possible cumulative error.

18. A receiver comprising:
a slicer configured to receive symbols of at least two different modulations;
the different modulations use subsets of same symbol superset that essentially equals highest modulation order;
at least some of the symbols are associated with a payload of a frame and are dynamically modulated;
the slicer further configured to fine slice the symbols using the symbol superset, and feed the fine slicing results and corresponding slicing errors to a physical coding sublayer (PCS);
the PCS configured to use the fine slicing results and the corresponding slicing errors to identify the frame, extract data describing at least some of the symbol modulations as function of symbol locations in the frame, provide improved slicing results based on the extracted symbol modulations, and feed the slicer with the extracted symbol modulations; and
the slicer further configured to slice at least a quarter of the received symbols, which are associated with the payload, according to the extracted symbol modulations, and feed a Decision Based Filter (DBF) with the result.

19. The receiver of claim 18, wherein before the slicer receives the extracted symbol modulations, the slicer feeds the DBF with a predefined slicer function.

20. The receiver of claim 19, wherein the receiver communicates with a transmitter configured to dynamically modulate the at least some of the symbols associated with the payload based on type of data conveyed by each symbol.

21. The receiver of claim 19, wherein the receiver communicates with a transmitter configured to achieve source coding by selecting different modulations for different symbols based on the symbols' data types.

22. The receiver of claim 19, wherein the slicing errors consist of direction of the slicing error.

* * * * *